United States Patent [19]
Jimenez

[11] Patent Number: 6,153,453
[45] Date of Patent: Nov. 28, 2000

[54] JFET TRANSISTOR MANUFACTURING METHOD

[75] Inventor: Jean Jimenez, Crolles, France

[73] Assignee: STMicroelectronics S.A., Gentilly, France

[21] Appl. No.: 09/281,454

[22] Filed: Mar. 30, 1999

[30] Foreign Application Priority Data

Mar. 31, 1998 [FR] France ................................. 98 04208

[51] Int. Cl.[7] .............................................. H01L 21/8238
[52] U.S. Cl. .......................... 438/200; 438/197; 438/199; 438/188; 438/189; 257/369; 257/133; 257/134; 257/272
[58] Field of Search .................................. 438/199, 197, 438/200, 188, 189, 196, 186, 201, 217, 211, 230, 231, 232, 299, 300, 305, 306; 257/133, 134, 272, 369

[56] References Cited

U.S. PATENT DOCUMENTS

| 5,296,409 | 3/1994 | Merrill et al. ............................ 438/189 |
| 5,605,851 | 2/1997 | Palmieri ................................. 438/194 |

FOREIGN PATENT DOCUMENTS

| 27 53 704 | 6/1979 | Germany . |
| WO 94/19828 | 9/1994 | WIPO . |

OTHER PUBLICATIONS

French Search Report from French Patent Application 98/04208, filed Mar. 31, 1998.
Patent Abstracts of Japan, vol. 018, No. 105 (E–1512), Feb. 21, 1994 & JP–A–05 304258 (Toshiba Corp,).

*Primary Examiner*—Charles Bowers
*Assistant Examiner*—Hsien Ming Lee
*Attorney, Agent, or Firm*—Wolf, Greenfield & Sacks, P.C.; James H. Morris; Theodore E. Galanthay

[57] ABSTRACT

The present invention relates to a method of manufacturing a JFET transistor in an integrated circuit containing complementary MOS transistors, this JFET transistor being formed in an N-type well of a P-type substrate, including the steps of forming a P-type channel region at the same time as lightly-doped drain/source regions of the P-channel MOS transistors of; forming an N-type gate region at the same time as lightly-doped drain/source regions of the N-channel MOS transistors; and forming P-type drain/source regions at the same time as heavily-doped drain/source regions of P-channel MOS transistors of channel.

4 Claims, 3 Drawing Sheets

JFET TRANSISTOR MANUFACTURING METHOD

BACKGROUND OF THE INVENTION

1. Field of the Invention

The present invention relates to the field of integrated circuits. More specifically, the present invention relates to the manufacturing of CMOS and JFET transistors in a semiconductor substrate.

2. Discussion of the Related Art

Integrated circuits meant to perform logic functions are generally made in CMOS technology. To perform analog functions, bipolar components are generally preferred to be used. However, the simultaneous forming of CMOS and bipolar components on the same chip requires the use of so-called BICMOS lines which are more expensive than CMOS lines. Thus, in many cases, MOS transistors, for example, are used as input/output transistors to perform the analog functions. However, in low frequency applications, these transistors have the disadvantage of exhibiting a high output noise level due to carrier recombinations at the interface between silicon and silicon oxide. To compensate this problem, which is intrinsic since it is linked to the very surface operating principle of MOS transistors, MOS transistors of large dimensions which have the disadvantage of consuming a large amount of silicon are used.

Junction field-effect transistors (JFET) are known to have, with respect to insulated gate field effect transistors (MOSFET, or merely MOS), the advantage of a lower noise. However, up to now, the integration of these latter components requires introducing additional steps in a current CMOS technology manufacturing process. This would result in preferring BICMOS technologies, with their cost disadvantages.

SUMMARY OF THE INVENTION

An object of the present invention is to provide a method of manufacturing integrated circuits which include MOS transistors and JFET transistors, the latter being formed with no additional step with respect to a conventional method of MOS transistor formation.

The present invention also aims at providing an integrated circuit made according to a method of simultaneous manufacturing of MOS transistors and of JFET transistors according to the present invention.

Such combinations of CMOS and JFET transistors apply, in particular, to the field of low frequency analog circuits, for example, input stages of audio circuits.

To achieve these and other objects, the present invention provides a method of manufacturing a JFET transistor in an integrated circuit containing complementary MOS transistors, this JFET transistor being formed in a well of a first conductivity type of a substrate of the second conductivity type, including the steps of forming a channel region of the second conductivity type at the same time as lightly-doped drain/source regions of the MOS transistors of channel of the second conductivity type; forming a gate region of the first conductivity type at the same time as lightly-doped drain/source regions of the MOS transistors of channel of the first conductivity type; and forming drain/source regions of the second conductivity type at the same time as heavily-doped drain/source regions of MOS transistors of channel of the second conductivity type.

According to an embodiment of the present invention, the substrate is doped at approximately a $10^{14}$ at./cm$^3$ dose, the well is doped at approximately $10^{16}$ at./cm$^3$, the JFET channel region is doped at approximately a $10^{18}$ at./cm$^3$ dose, its gate region is doped at approximately $10^{20}$ at./cm$^3$, and its drain/source regions are doped at approximately $10^{20}$ at./cm$^3$.

The present invention also provides a method of manufacturing a JFFT transistor with a channel of a first conductivity type in a substrate of the second conductivity type of an integrated circuit containing complementary MOS transistors including the steps of forming a channel region of the first conductivity type at the same time as regions of insulation of the MOS transistors of channel of the second conductivity type; forming a gate region of the second conductivity type at the same time as lightly-doped drain/source regions of the MOS transistors of channel of the second conductivity type; and forming drain/source regions of the first conductivity type at the same time as heavily-doped drain/source regions of the MOS transistors of channel of the first conductivity type.

According to an embodiment of the present invention, the substrate is doped at approximately a $10^{14}$ at./cm$^3$ dose, its channel region of the JFET transistor of channel of a first conductivity type is doped at a dose from approximately $10^{17}$ at./cm$^3$ to $10^{18}$ at./cm$^3$, its gate region is doped at approximately $10^{20}$ at./cm$^3$, and its drain/source regions are doped at approximately $10^{20}$ at./cm$^3$.

The present invention also aims at an integrated circuit including JFET transistors of the above type.

The foregoing objects, features and advantages of the present invention will be discussed in detail in the following non-limiting description of specific embodiments in connection with the accompanying drawings.

DETAILED DESCRIPTION

For clarity, as usual in the representation of integrated circuits, the different drawings are not to scale. Further, the same elements have been referred to with the same references.

Figure 1:
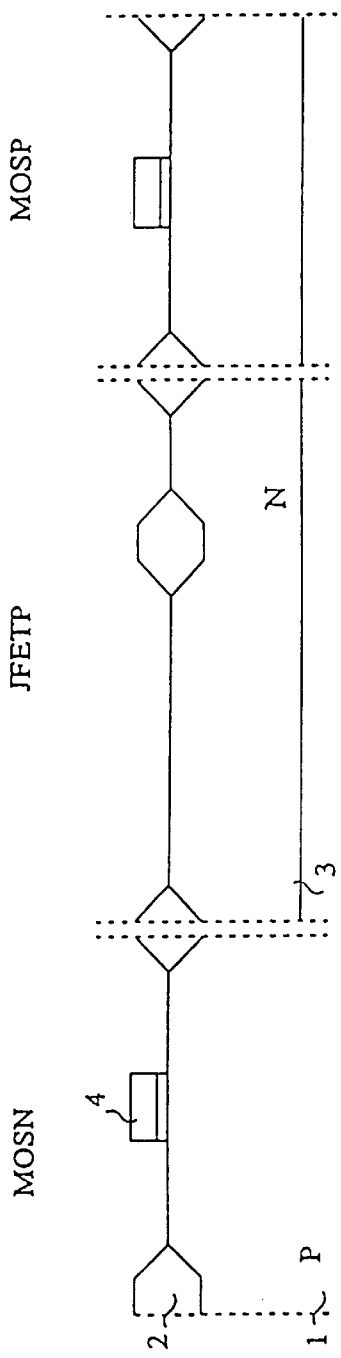
FIGS. 1 to 5 illustrate successive steps of a manufacturing method of a JFET transistor according to the present invention.

FIG. 1 illustrates the result of initial steps of a manufacturing method according to the present invention. At the surface of a doped semiconductor 1 of a type P, active regions are delimited by thick field oxide regions 2. It should be noted that the word substrate is here used to designate an upper layer or region of a semiconductor component, for example, an integrated circuit. It is desired to form in substrate 1, in the left-hand portion of the drawings, an N-channel MOS transistor MOSN, in the central portion of the drawings, a P-channel JFET transistor JFETP, and to the right of the drawings, a P-channel MOS transistor MOSP. In the following description, MOSN, JFETP, and MOSP will be used to designate a finished transistor as well as a portion of the substrate or of a well in which the corresponding transistor is being formed. Lightly-doped N-type wells 3 have been formed in substrate 1, in the regions where transistors JFETP and MOSP are to be formed. Several insulated structures 4 formed of an insulating layer, for example, silicon oxide, and of a conductive layer, for example, polysilicon, meant to form the gates of each of transistors MOSN and MOSP have also been formed on this substrate, typically made of silicon.

Figure 2:
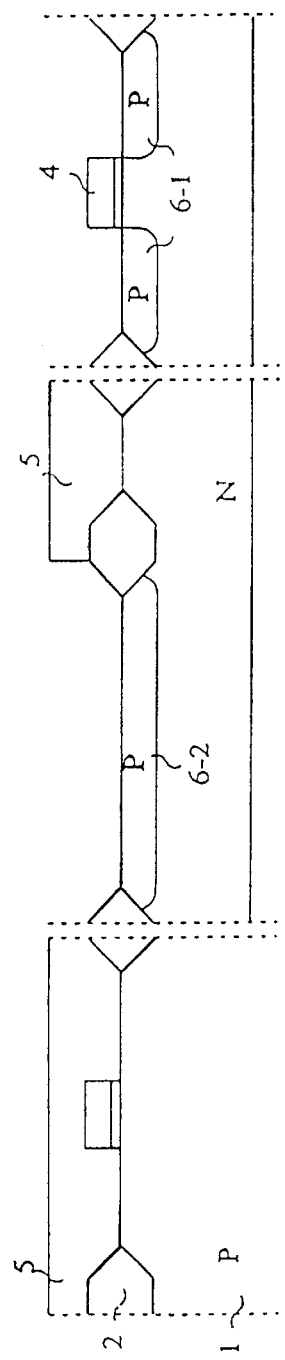

At the following step, illustrated in FIG. 2, a first mask 5 is formed and opened to expose the regions in which transistors JFETP and MOSP are to be formed. A P-type dopant adapted to forming lightly-doped drain/source regions 6-1 of the MOSP transistors (so-called IDD regions) is then implanted. In the JFETP regions, this implantation enables forming a P-type channel region 6-2.

Figure 3:
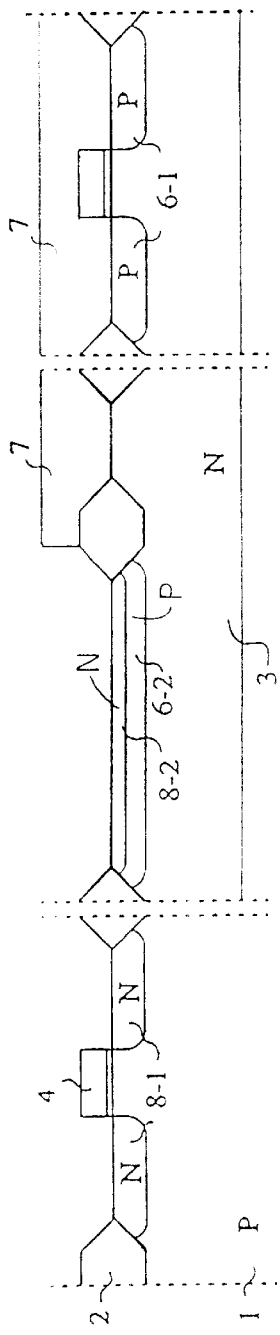

At the next step, illustrated in FIG. 3, a second mask 7 is formed and opened to expose transistors MOSN and JFETP. A dopant adapted to forming lightly-doped N-type drain/source regions 8-1 of the MOS transistors is then LDD implanted. This implantation is advantageously used to form an N-type region 8-2 of transistor JFETP which can be called the gate region of transistor JFETP.

At the following steps (not shown), spacers are conventionally formed on the edges of the gate structures 4 of the different MOS transistors.

Figure 4:
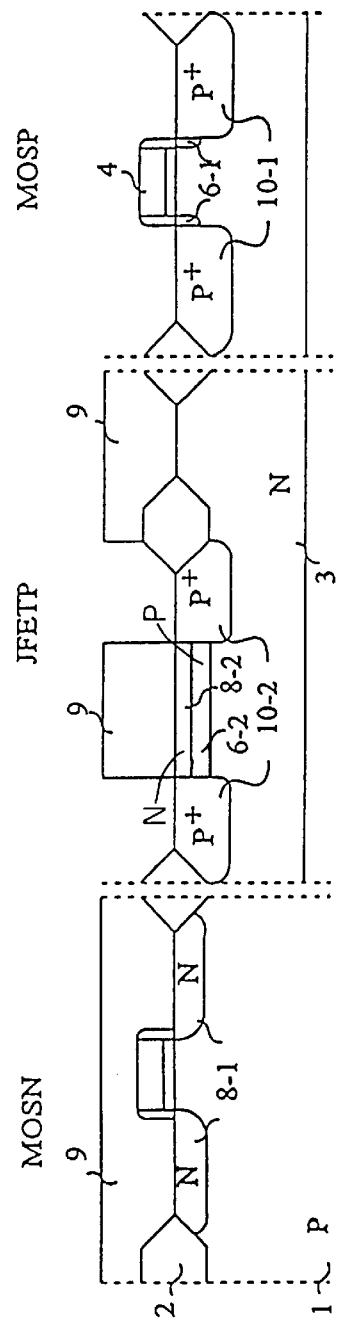

At the following step, illustrated in FIG. 4, a third mask 9 is formed and opened, to expose transistors MOSP and the portions of region JFETP in which the drain/source of this transistor are to be formed. A high dose implantation, meant to form heavily-doped P-type regions 10-1 of the MOSP transistors is then performed. This implantation is also used to form source regions 10-2 of transistor JFETP.

Figure 5:
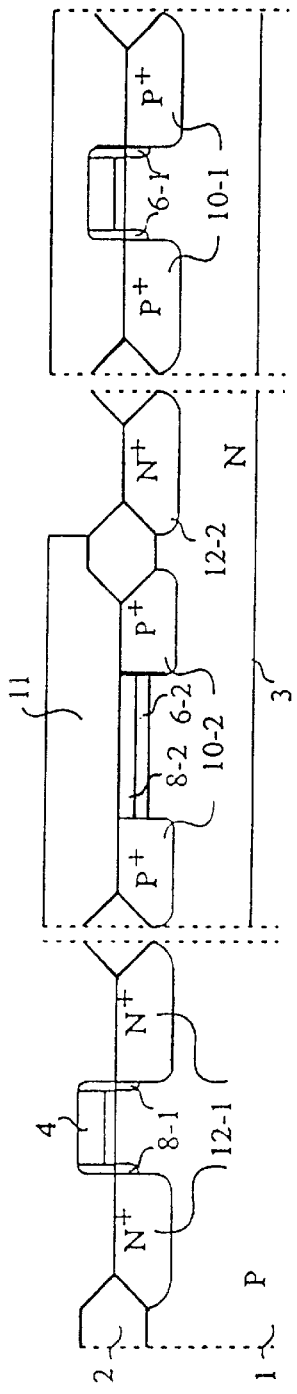

At the following step, illustrated in FIG. 5, a fourth mask 11 is formed and opened, to expose transistors MOSN and, above wells 3, the active region in which a well contact recovery region of the JFET transistor is to be formed. An implantation meant to form heavily-doped N-type drain/source regions 12-1 of transistors MOSN is then performed. This implantation is also used to form in well 3 a heavily-doped region 12-2 which will form a well contact recovery area.

The following contacting steps, including possible steps of silicidation and of deposition of one or several metallization levels, are performed conventionally. For each JFET transistor, a single control terminal connected to the well (region 12-2) and to the gate region (region 8-2) is conventionally made, to improve the efficiency of the channel region (region 6-2) pinch.

Thus, the method according to the present invention enables simultaneous formation with no additional step of the JFET transistors at the same time as the CMOS transistors.

As an example, the different doping levels of the JFET transistor may be:

P-type substrate 1: $10^{14}$ at./cm$^3$;
N-type wells 3: $10^{16}$ at./cm$^3$;
P-channel region 6-2: $10^{17}$–$10^{18}$ at./cm$^3$;
N-type gate region 8-2: $10^{20}$ at./cm$^3$;
P-type drain/source regions 10-2: $10^{20}$ at./cm$^3$.

Figure 6:
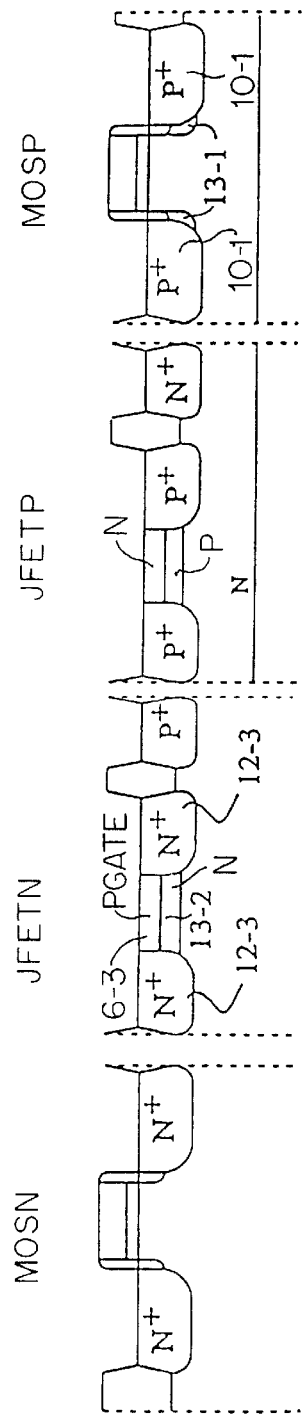
FIG. 6 illustrates an alternative association according to the present invention of JFET transistors and of CMOS transistors.

As illustrated in FIG. 6, N-channel JFET transistors JFETN may further be formed. This will be described in the case where the P-channel MOS transistors include, in addition to the previously-described layers and regions, an N-type region 13-1, currently called anti-punch-through region, under drain extension regions (LDD) 6-1. Then, N-type channel region 13-2 of transistor JFETN is formed by the same implantation as that performed to form anti-punch-through regions 13-1 of transistors MOSP, before proceeding to the P-type LDD implantation step, previously described in relation with FIG. 2.

In this case, this last LDD implantation according to the present invention (FIG. 2) is also used to form gate region 6-3 of transistor JFETN.

Finally, the LDD implantation step according to the present invention, previously described in elation with FIG. 5, is also used to form heavily-doped N-type drain/source regions 12-3 of transistor JFETN.

As an example, the different doping levels of transistor JFETN may be:

P-type substrate 1: $10^{14}$ at./cm$^3$;
N-channel region 13-2: $10^{17}$ at./cm$^3$;
P-type gate region 6-3: $10^{18}$ at./cm$^3$;
N-type drain/source regions 12-3: $10^{20}$ at./cm$^3$.

Thus, the present invention enables, in a method of CMOS transistor manufacturing, simultaneous formation of JFET transistors with no additional step.

These JFET transistors, having a volume operation, and not a surface operation, are free of the problems of carrier recombination at the level of interfaces between silicon and silicon oxide. The obtained output signals are thus less noisy, especially in low frequency applications. An integrated circuit having some advantages of a BICMOS circuit can thus be obtained by using a mere conventional CMOS line.

Of course, the present invention is likely to have various alterations, modifications, and improvements which will readily occur to those skilled in the art. In particular, although the present invention has been described in the case of the simultaneous manufacturing of CMOS and JFET transistors in a P-type semiconductor substrate and N-type well technology, it also applies to the formation on a same N-type substrate of CMOS transistors and of complementary JFET transistors in an N-type substrate and P-well technology.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a JFET transistor in an integrated circuit containing complementary MOS transistors, this JFET transistor being formed in a well of a first conductivity type of a substrate of the second conductivity type, including the steps of:

forming a JFET channel region of the second conductivity type at the same time as lightly-doped drain/source regions of the second conductivity type-channel MOS transistors;

forming a JFET gate region of the first conductivity type at the same time as lightly-doped drain/source regions of the first conductivity type-channel MOS transistors; and forming JFET drain/source regions of the second conductivity type at the same time as heavily-doped drain/source regions of second conductivity type-channel MOS transistors.

2. The method of claim 1, wherein the substrate is doped at a $10^{14}$ at./cm$^3$ dose, the well is doped at $10^{16}$ at./cm$^3$, the JFET channel region is doped at a $10^{18}$ at./cm$^3$ dose, the JFET gate region is doped at $10^{20}$ at./cm$^3$, and the JFET drain/source regions are doped at $10^{20}$ at./cm$^3$.

3. A method of manufacturing a first conductivity type-channel JFET transistor in a substrate of the second conductivity type of an integrated circuit containing complementary MOS transistors, including the steps of:

forming a channel region of the first conductivity type at the same time as anti-punch through regions of the second conductivity type-channel MOS transistors;

forming a gate region of the second conductivity type at the same time as lightly-doped drain/source regions of the second conductivity type-channel MOS transistors; and forming drain/source regions of the first conductivity type at the same time as heavily-doped drain/source regions of the first conductivity type-channel MOS transistors.

4. The method of claim 3, wherein the substrate is doped at a $10^{14}$ at./cm$^3$ dose, its channel region of the first conductivity type-channel JFET transistor is doped at a dose from $10^{17}$ at./cm$^3$ to $10^{18}$ at./cm$^3$, its gate region is doped at $10^{20}$ at./cm$^3$, and its drain/source regions are doped at $10^{20}$ at./cm$^3$.

* * * * *